US 11,303,308 B2

(12) United States Patent
Uejima

(10) Patent No.: US 11,303,308 B2
(45) Date of Patent: Apr. 12, 2022

(54) RADIO FREQUENCY MODULE AND COMMUNICATION DEVICE

(71) Applicant: Murata Manufacturing Co., Ltd., Nagaokakyo (JP)

(72) Inventor: Takanori Uejima, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/118,610

(22) Filed: Dec. 11, 2020

(65) Prior Publication Data

US 2021/0099190 A1 Apr. 1, 2021

Related U.S. Application Data

(63) Continuation of application No. PCT/JP2019/023804, filed on Jun. 17, 2019.

(30) Foreign Application Priority Data

Jun. 20, 2018 (JP) .............................. JP2018-117161

(51) Int. Cl.
*H04B 1/00* (2006.01)
*H04B 1/04* (2006.01)
*H04B 1/10* (2006.01)

(52) U.S. Cl.
CPC ............ *H04B 1/006* (2013.01); *H04B 1/0057* (2013.01); *H04B 1/0475* (2013.01); *H04B 1/1018* (2013.01); *H04B 2001/0408* (2013.01)

(58) Field of Classification Search
CPC .... H04B 1/005; H04B 1/0053; H04B 1/0057; H04B 1/006; H04B 1/0067; H04B 1/0075;

(Continued)

(56) References Cited

U.S. PATENT DOCUMENTS 8,036,148 B2 * 10/2011 Fukamachi .............. H04B 1/44
370/282
8,130,787 B2 * 3/2012 Hagiwara ............ H04B 7/0842
370/463

(Continued)

FOREIGN PATENT DOCUMENTS

CN 207399201 U 5/2018
JP 2006-121514 A 5/2006

(Continued)

OTHER PUBLICATIONS

International Search Report and Written Opinion dated Aug. 27, 2019, received for PCT Application PCT/JP2019/023804, Filed on Jun. 17, 2019, 7 pages including English Translation.

(Continued)

*Primary Examiner* — Young T. Tse
(74) *Attorney, Agent, or Firm* — Xsensus LLP

(57) ABSTRACT

A radio frequency module includes: a transmission power amplifier that includes a plurality of amplifying elements that are cascaded; and a module board on which the transmission power amplifier is mounted, the module board including a first principal surface and a second principal surface on opposite sides of the module board. The plurality of amplifying elements include: a first amplifying element mounted on the first principal surface; and a second amplifying element mounted on the second principal surface and disposed upstream on a signal path from the first amplifying element.

20 Claims, 4 Drawing Sheets

(58) Field of Classification Search
CPC .......... H04B 1/0078; H04B 1/03; H04B 1/04;
H04B 1/0458; H04B 1/0457; H04B
1/0483; H04B 1/1018; H04B 1/1036;
H04B 1/44; H04B 1/48; H04B 7/0602;
H04B 2001/0408; H04B 2001/0416
USPC ....... 375/219, 220, 222, 259, 260, 262, 265,
375/267, 297, 318; 343/876; 370/277,
370/278, 282; 455/78, 80, 82–84, 88,
455/114.3
See application file for complete search history.

(56) References Cited

U.S. PATENT DOCUMENTS

| | | | | |
|---|---|---|---|---|
| 9,780,735 | B1* | 10/2017 | Obiya | ...................... H03F 3/195 |
| 2005/0151599 | A1* | 7/2005 | Ido | ........................... H03H 9/72 |
| | | | | 333/133 |
| 2011/0304388 | A1* | 12/2011 | Yamawaki | ............. H04B 1/006 |
| | | | | 327/557 |
| 2018/0131501 | A1* | 5/2018 | Little | ................... H04B 1/0064 |
| 2018/0226367 | A1* | 8/2018 | Babcock | ................. H03F 1/347 |
| 2018/0226928 | A1* | 8/2018 | Obiya | ...................... H04B 1/18 |
| 2018/0316311 | A1* | 11/2018 | Gebeyehu | ............. H03F 1/0227 |
| 2019/0267339 | A1* | 8/2019 | Murase | .................... H04B 1/40 |

FOREIGN PATENT DOCUMENTS

| | | |
|---|---|---|
| JP | 2011-124621 A | 6/2011 |
| JP | 2013-59033 A | 3/2013 |
| JP | 2014-42094 A | 3/2014 |
| KR | 10-2016-0100796 A | 8/2016 |
| WO | 2007/083668 A1 | 7/2007 |
| WO | 2018/043162 A1 | 3/2018 |

OTHER PUBLICATIONS

English Translation of Written Opinion dated Aug. 27, 2019, received for PCT Application PCT/JP2019/023804, Filed on Jun. 17, 2019, 4 pages.

Korean Office Action dated Nov. 17, 2021 in Korean Application No. 10-2020-7034961.

* cited by examiner

RADIO FREQUENCY MODULE AND COMMUNICATION DEVICE

CROSS REFERENCE TO RELATED APPLICATIONS

This is a continuation application of PCT International Application No. PCT/JP2019/023804 filed on Jun. 17, 2019, designating the United States of America, which is based on and claims priority to Japanese Patent Application No. 2018-117161 filed on Jun. 20, 2018. The entire disclosures of the above-identified applications, including the specifications, drawings and claims are incorporated herein by reference in their entirety.

TECHNICAL FIELD

The present disclosure relates to a radio frequency (RF) module and a communication device.

BACKGROUND

In mobile communication apparatuses such as mobile phones, the arrangement of circuit elements included in radio frequency front-end circuits has been made complicated along with the development in multiband technology, in particular.

Japanese Unexamined Patent Application Publication No. 2006-121514 discloses a high frequency radio unit (a radio frequency module) having a configuration in which a receiver low noise amplifier (a reception low noise amplifier) and a transmitter power amplifier (a transmission power amplifier) are connected via an antenna switch. The low noise amplifier and the power amplifier each include, for example, cascaded amplifying elements, but share a component such as a bias circuit, thus reducing the number of components of the high frequency radio unit.

SUMMARY

Technical Problems

However, as recognized by the present inventor, when a transceiver (a transmission and reception circuit) disclosed in Japanese Unexamined Patent Application Publication No. 2006-121514 is achieved by a single module as a front-end circuit (a radio frequency module) of a mobile communication apparatus, if the transmission power amplifier includes cascaded amplifying elements in order to increase output power, the size of the radio frequency module increases, which is a problem.

The present disclosure has been conceived in order to solve the above-identified and other problems, and provides a miniaturized radio frequency module and a miniaturized communication device each including a transmission power amplifier that includes cascaded amplifying dements.

Solutions

In order to provide such a radio frequency module, a radio frequency module according to an aspect of the present disclosure includes: a first transmission power amplifier that includes a plurality of amplifying dements that are cascaded; and a module board on which the first transmission power amplifier is mounted, the module board including a first principal surface and a second principal surface on opposite sides of the module board. The plurality of amplifying elements include: a first amplifying element disposed most downstream of the plurality of amplifying elements; and a second amplifying dement disposed upstream of the first amplifying element, the first amplifying element is mounted on the first principal surface, and the second amplifying element is mounted on the second principal surface.

Advantageous Effects

According to the present disclosure, a miniaturized radio frequency module and a miniaturized communication device each including a transmission power amplifier that includes cascaded amplifying elements can be provided.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
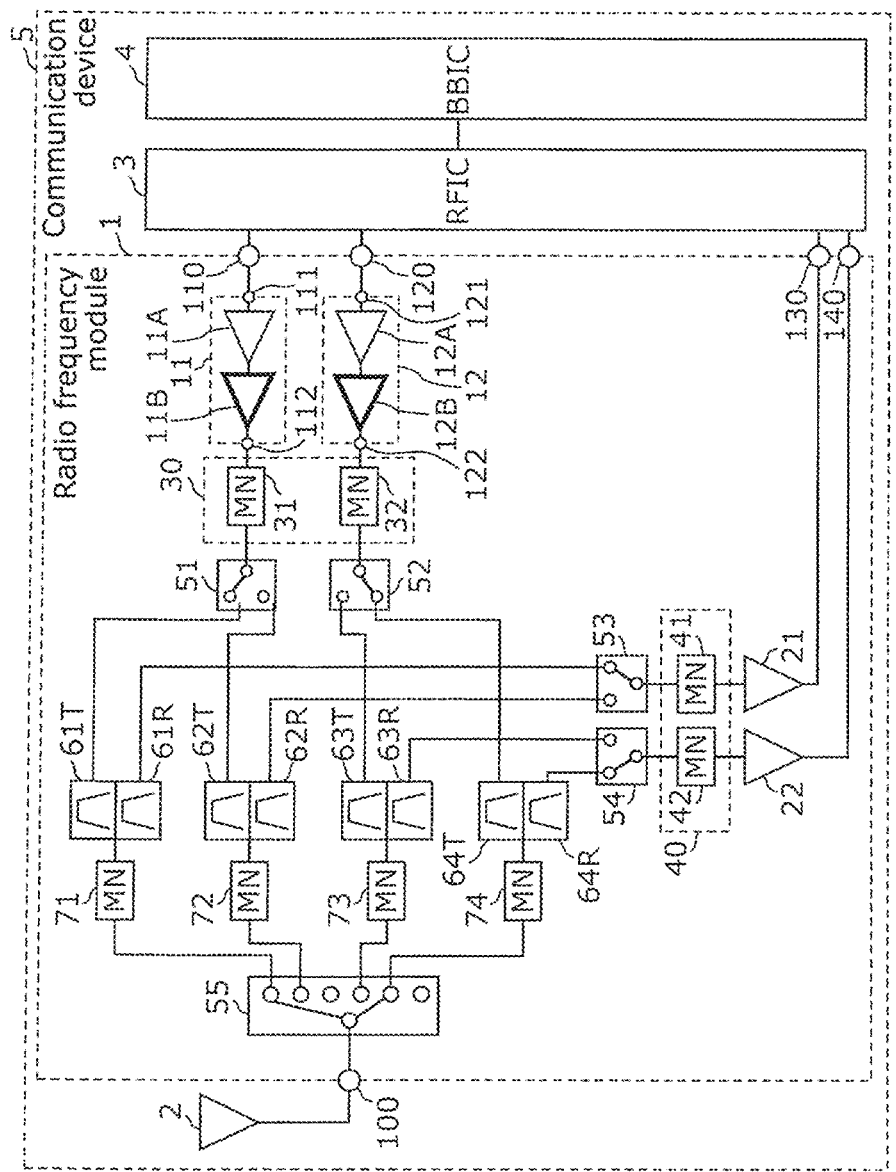
FIG. 1 illustrates a circuit configuration of a radio frequency module according to an embodiment.

The following describes in detail an embodiment of the present disclosure and variations thereof with reference to the drawings. Note that the embodiment and variations thereof described below each show a general or specific example. The numerical values, shapes, materials, elements, and the arrangement and connection of the elements, for instance, described in the following embodiment and variations thereof are examples, and thus are not intended to limit the present disclosure. Among the elements in the following embodiment and variations thereof, elements not recited in any of the independent claims are described as arbitrary elements. In addition, the sizes of elements and the ratios of the sizes illustrated in the drawings are not necessarily accurate.

Note that in the following embodiment, regarding A, B, and C mounted on a board, "C is disposed between A and B in a plan view of the board (or a principal surface of the board)" defines that at least a portion of the region occupied by C projected in the plan view of the board overlaps a line that connects an arbitrary point in the region occupied by A projected in the plan view of the board and an arbitrary point in the region occupied by B projected in the plan view of the board.

Embodiment

[1.1 Circuit Configuration of Radio Frequency Module 1 and Communication Device 5]

FIG. 1 illustrates a circuit configuration of radio frequency module 1 according to an embodiment. As illustrated in FIG. 1, communication device 5 includes radio frequency module 1, antenna 2, radio frequency (RF) signal processing circuit (RF integrated circuit (RFIC)) 3, and baseband signal processing circuit (BB integrated circuit (BBIC)) 4.

RFIC 3 is an RF signal processing circuit that processes radio frequency signals transmitted and received by antenna 2. Specifically, RFIC 3 processes a radio frequency reception signal input through a reception path of radio frequency module 1 by down-conversion, for instance, and outputs a reception signal generated by being processed to BBIC 4. RFIC 3 processes a transmission signal input from BBIC 4 by up-conversion, for instance, and outputs a radio frequency transmission signal generated by being processed to a transmission path of radio frequency module 1.

BBIC 4 is a circuit that processes signals using an intermediate frequency band lower than the frequency range of a radio frequency signal that propagates in radio frequency module 1. A signal processed by BBIC 4 is used, for example, as an image signal for image display or as an audio signal for talk through a loudspeaker.

RFIC 3 also functions as a controller that controls connection made by switches 51, 52, 53, 54, and 55 included in radio frequency module 1, based on a communication band (a frequency band) to be used. Specifically, RFIC 3 changes connection made by switches 51 to 55 included in radio frequency module 1 according to a control signal (not illustrated). Note that the controller may be disposed outside of RFIC 3, in radio frequency module 1 or BBIC 4, for example.

Antenna 2 is connected to antenna connection terminal 100 of radio frequency module 1, radiates a radio frequency signal output from radio frequency module 1, and receives and outputs a radio frequency signal from the outside to radio frequency module 1.

Note that antenna 2 and BBIC 4 are not necessarily included in communication device 5 according to the present embodiment.

Next, a detailed configuration of radio frequency module 1 is to be described.

As illustrated in FIG. 1, radio frequency module 1 includes common terminal 100, transmission input terminals 110 and 120, reception output terminals 130 and 140, transmission power amplifiers 11 and 12, reception low noise amplifiers 21 and 22, transmission filters 61T, 62T, 63T, and 64T, reception filters 61R, 62R, 63R, and 64R, transmission output matching circuit 30, reception input matching circuit 40, matching circuits 71, 72, 73, and 74, and switches 51, 52, 53, 54, and 55.

Common terminal 100 is connected to antenna 2.

Transmission power amplifier 11 is a first transmission power amplifier that receives input of radio frequency signals through transmission input terminal 110, preferentially amplifies radio frequency signals of communication band A (a first communication band) and communication band B that belong to a first frequency band group, and outputs the amplified radio frequency signals toward common terminal 100.

Transmission power amplifier 12 is a second transmission power amplifier that receives input of radio frequency signals through transmission input terminal 120, preferentially amplifies radio frequency signals of communication band C (a second communication band) and communication band D that belong to a second frequency band group having higher frequency bands than the first frequency band group, and outputs the amplified radio frequency signals toward common terminal 100. Transmission power amplifiers 11 and 12 are power amplifiers, for example.

Transmission power amplifier 11 includes amplifier input terminal 111, amplifier output terminal 112, and amplifying elements 11A and 11B. Amplifying elements 11A and 11B are connected between amplifier input terminal 111 and amplifier output terminal 112, and are cascaded (tandemly connected) to each other. Amplifying element 11B is a first amplifying element disposed downstream out of amplifying elements 11A and 11B, and amplifying element 11A is a second amplifying element disposed upstream of amplifying element 11B.

Transmission power amplifier 12 includes amplifier input terminal 121, amplifier output terminal 122, and amplifying elements 12A and 12B. Amplifying elements 12A and 12B are connected between amplifier input terminal 121 and amplifier output terminal 122, and are cascaded (tandemly connected) to each other. Amplifying element 12B is a first amplifying element disposed downstream out of amplifying elements 12A and 12B, and amplifying element 12A is a second amplifying element disposed upstream of amplifying element 12B.

Amplifying elements 11A, 11B, 12A, and 12B each include, for example, a field effect transistor that includes a complementary metal oxide semiconductor (CMOS) that contains silicon (Si), a field effect transistor made of GaAs, or a bipolar transistor made of GaAs. Note that amplifying elements 11A and 12A that do not require power handling each include a CMOS that contains Si, and thus radio frequency module 1 can be manufactured at low cost. On the other hand, amplifying elements 11B and 12B that output high-power radio frequency transmission signals are each made of a GaAs-based material, and thus can output radio frequency transmission signals having high-quality amplification characteristics and high-quality noise characteristics.

Amplifying elements 11A and 12A that do not require power handling may be formed, using a CMOS that contains Si, into a single chip together with switches 51 to 55 and a controller that controls connection of switches 51 to 55 and amplification factors of transmission power amplifiers 11 and 12 and reception low noise amplifiers 21 and 22. Accordingly, radio frequency module 1 can be miniaturized.

Note that transmission power amplifiers 11 and 12 each include two amplifying elements that are cascaded in the present embodiment, but may include three or more amplifying elements that are cascaded. Thus, each of the first transmission power amplifier and the second transmission power amplifier may include three or more amplifying elements that are cascaded. In this case, out of the amplifying elements, an amplifying element disposed most downstream is a first amplifying element, and an amplifying element disposed upstream of the first amplifying element is a second amplifying element.

Reception low noise amplifier 21 is a first reception low noise amplifier that amplifies radio frequency signals of communication bands A and B while noise is kept low. Reception low noise amplifier 22 is a second reception low noise amplifier that amplifies radio frequency signals of communication bands C and D while noise is kept low. Reception low noise amplifiers 21 and 22 are low noise amplifiers, for example.

Transmission filter 61T is disposed on a transmission path that connects transmission power amplifier 11 and common terminal 100, and passes a radio frequency signal of a transmission band of communication band A included in a radio frequency signal amplified by transmission power amplifier 11. Transmission filter 62T is disposed on a transmission path that connects transmission power amplifier 11 and common terminal 100, and passes a radio frequency signal of a transmission band of communication band B included in a radio frequency signal amplified by transmission power amplifier 11. Transmission filter 63T is disposed on a transmission path that connects transmission power amplifier 12 and common terminal 100, and passes a radio frequency signal of a transmission band of communication band C included in a radio frequency signal amplified by transmission power amplifier 12. Transmission filter 64T is disposed on a transmission path that connects transmission power amplifier 12 and common terminal 100, and passes a radio frequency signal of a transmission band of communication band D included in a radio frequency signal amplified by transmission power amplifier 12.

Reception filter 61R is disposed on a reception path that connects reception low noise amplifier 21 and common terminal 100, and passes a radio frequency signal of a reception band of communication band A included in a radio frequency signal input through common terminal 100. Reception filter 62R is disposed on a reception path that connects reception low noise amplifier 21 and common terminal 100, and passes a radio frequency signal of a reception band of communication band B included in a radio frequency signal input through common terminal 100. Reception filter 63R is disposed on a reception path that connects reception low noise amplifier 22 and common terminal 100, and passes a radio frequency signal of a reception band of communication band C included in a radio frequency signal input through common terminal 100. Reception filter 64R is disposed on a reception path that connects reception low noise amplifier 22 and common terminal 100, and passes a radio frequency signal of a reception band of communication band D included in a radio frequency signal input through common terminal 100.

Note that transmission filters 61T to 64T and reception filters 61R to 64R may each be any of, for example, a surface acoustic wave filter, an acoustic wave filter that uses bulk acoustic waves (BAWs), an inductor-capacitor (LC) resonance filter, and a dielectric filter, and furthermore, are not limited to such filters.

Transmission filter 61T and reception filter 61R are included in duplexer 61 having a passband that is communication band A. Transmission filter 62T and reception filter 62R are included in duplexer 62 having a passband that is communication band B. Transmission filter 63T and reception filter 63R are included in duplexer 63 having a passband that is communication band C. Transmission filter 64T and reception filter 64R are included in duplexer 64 having a passband that is communication band D.

Transmission output matching circuit 30 includes matching circuits 31 and 32. Matching circuit 31 is disposed on transmission paths between transmission power amplifier 11 and transmission filters 61T and 62T, and matches the impedance between transmission power amplifier 11 and transmission filter 61T and the impedance between transmission power amplifier 11 and transmission filter 62T. Matching circuit 32 is disposed on transmission paths between transmission power amplifier 12 and transmission filters 63T and 64T, and matches the impedance between transmission power amplifier 12 and transmission filter 63T and the impedance between transmission power amplifier 12 and transmission filter 64T.

Reception input matching circuit 40 includes matching circuits 41 and 42. Matching circuit 41 is disposed on reception paths between reception low noise amplifier 21 and reception filters 61R and 62R, and matches the impedance between reception low noise amplifier 21 and reception filter 61R and the impedance between reception low noise amplifier 21 and reception filter 62R. Matching circuit 42 is disposed on reception paths between reception low noise amplifier 22 and reception filters 63R and 64R, and matches the impedance between reception low noise amplifier 22 and reception filter 63R and the impedance between reception low noise amplifier 22 and reception filter 64R.

Switch 51 is a first switch that is disposed on transmission paths that connect matching circuit 31 and transmission filters 61T and 62T, and switches between conduction and non-conduction between common terminal 100 and transmission power amplifier 11. More specifically, switch 51 switches connection of transmission power amplifier 11 between transmission filter 61T and transmission filter 62T. Switch 51 includes a single pole double throw (SPDT) switch circuit that includes, for example, a common terminal connected to matching circuit 31, one selection terminal connected to transmission filter 61T, and another selection terminal connected to transmission filter 62T.

Switch 52 is a first switch that is disposed on transmission paths that connect matching circuit 32 and transmission filters 63T and 64T, and switches between conduction and non-conduction between common terminal 100 and transmission power amplifier 12. More specifically, switch 52 switches connection of transmission power amplifier 12 between transmission filter 63T and transmission filter 64T. Switch 52 includes an SPDT switch circuit that includes, for example, a common terminal connected to matching circuit 32, one selection terminal connected to transmission filter 63T, and another selection terminal connected to transmission filter 64T.

Switch 53 is a second switch that is disposed on reception paths that connect matching circuit 41 and reception filters 61R and 62R, and switches between conduction and non-conduction between common terminal 100 and reception low noise amplifier 21. More specifically, switch 53 switches connection of reception low noise amplifier 21 between reception filter 61R and reception filter 62R. Switch 53 includes an SPDT switch circuit that includes, for example, a common terminal connected to matching circuit 41, one selection terminal connected to reception filter 61R, and another selection terminal connected to reception filter 62R.

Switch 54 is a second switch that is disposed on reception paths that connect matching circuit 42 and reception filters 63R and 64R, and switches between conduction and non-conduction between common terminal 100 and reception low noise amplifier 22. More specifically, switch 54 switches connection of reception low noise amplifier 22 between reception filter 63R and reception filter 64R. Switch 54 includes an SPDT switch circuit that includes, for example, a common terminal connected to matching circuit 42, one selection terminal connected to reception filter 63R, and another selection terminal connected to reception filter 64R.

Switch 55 is disposed on signal paths that connect common terminal 100 to transmission filters 61T to 64T and reception filters 61R to 64R, is a first switch that switches between conduction and non-conduction between common terminal 100 and transmission power amplifier 11, and is a second switch that switches between conduction and non-conduction between common terminal 100 and reception low noise amplifier 21. More specifically, switch 55 switches among (1) connection between common terminal 100 and duplexer 61, (2) connection between common terminal 100 and duplexer 62, (3) connection between common terminal 100 and duplexer 63, and (4) connection between common terminal 100 and duplexer 64. Note that switch 55 may include a switch circuit that makes only one of connections (1) to (4) above or may include a multi-connection switch circuit that can simultaneously make two or more of connections (1) to (4) above.

Matching circuit 71 is disposed on a path that connects switch 55 to transmission filter 61T and reception filter 61R, and matches the impedance between (i) transmission filter 61T and (ii) antenna 2 and switch 55, and the impedance between (i) reception filter 61R and (ii) antenna 2 and switch 55. Matching circuit 72 is disposed on a path that connects switch 55 to transmission filter 62T and reception filter 62R, and matches the impedance between (i) transmission filter 62T and (ii) antenna 2 and switch 55, and the impedance between (i) reception filter 62R and (ii) antenna 2 and switch 55. Matching circuit 73 is disposed on a path that connects switch 55 to transmission filter 63T and reception filter 63R, and matches the impedance between (i) transmission filter 63I and (ii) antenna 2 and switch 55, and the impedance between (i) reception filter 63R and (ii) antenna 2 and switch 55. Matching circuit 74 is disposed on a path that connects switch 55 to transmission filter 64T and reception filter 64R, and matches the impedance between (i) transmission filter 64T and (ii) antenna 2 and switch 55, and the impedance between (i) reception filter 64R and (ii) antenna 2 and switch 55.

Note that it is sufficient if the radio frequency module according to the present disclosure amplifies radio frequency signals of the first frequency band group and outputs the amplified radio frequency signals, so that transmission power amplifier 11 is essential for the radio frequency module. Thus, the radio frequency module according to the present disclosure does not necessarily include common terminal 100, transmission input terminal 110, reception low noise amplifiers 21 and 22, transmission output matching circuit 30, reception input matching circuit 40, transmission filters 61T to 64T, reception filters 61R to 64R, switches 51 to 55, matching circuits 71 to 74, or reception output terminals 130 and 140. Thus, the radio frequency module may be a system that transmits radio frequency signals of a single communication band, rather than simultaneously transmitting, simultaneously receiving, or simultaneously transmitting and receiving radio frequency signals of two or more communication bands.

In the above configuration of radio frequency module 1, transmission power amplifier 11, matching circuit 31, switch 51, and transmission filters 61T and 62T are included in a first transmission circuit that outputs radio frequency signals of communication band A and communication band B toward common terminal 100. Transmission power amplifier 12, matching circuit 32, switch 52, and transmission filters 63T and 64T are included in a second transmission circuit that outputs radio frequency signals of communication band C and communication band D toward common terminal 100. The first transmission circuit and the second transmission circuit are included in a transmission circuit that outputs radio frequency transmission signals of communication bands A to D toward common terminal 100.

Reception low noise amplifier 21, matching circuit 41, switch 53, and reception filters 61R and 62R are included in a first reception circuit that receives input of radio frequency signals of communication band A and communication band B from antenna 2 through common terminal 100. Reception low noise amplifier 22, matching circuit 42, switch 54, and reception filters 63R and 64R are included in a second reception circuit that receives input of radio frequency signals of communication band C and communication band D from antenna 2 through common terminal 100. The first reception circuit and the second reception circuit are included in a reception circuit that receives input of radio frequency signals of communication bands A to D through common terminal 100.

According to the circuit configuration, radio frequency module 1 according to the present embodiment can carry out at least one of simultaneous transmission, simultaneous reception, or simultaneous transmission and reception of a radio frequency signal of communication band A or communication band B and a radio frequency signal of communication band C or communication band D.

Here, when the circuit elements described above are modularized as a compact front-end circuit, transmission power amplifiers 11 and 12 each include cascaded amplifying elements, and thus the number of components of radio frequency module 1 increases. Accordingly, the size of a conventional radio frequency module increases. Furthermore, it is difficult to achieve both of reduction in signal transmission loss by disposing the cascaded amplifying elements adjacent to one another and reduction in interference between the cascaded amplifying elements, in mounting such circuit elements on a single board. Thus, it is difficult to miniaturize the radio frequency module that includes circuit elements mounted on a single board, while ensuring favorable amplification characteristics of a transmission power amplifier that includes cascaded amplifying elements.

In contrast, even if radio frequency module 1 according to the present embodiment includes transmission power amplifiers 11 and 12 each including cascaded amplifying elements, radio frequency module 1 can be miniaturized (the area thereof can be decreased). Furthermore, radio frequency module 1 can be miniaturized while reducing signal transmission loss of transmission power amplifiers 11 and 12 and reducing interference between amplifying elements 11A and 11B of transmission power amplifier 11 and interference between amplifying elements 12A and 12B of transmission power amplifier 12. The following describes the arrangement of circuit elements included in radio frequency module 1 according to the present embodiment.

[1.2 Arrangement of Transmission Power Amplifiers of Radio Frequency Module 1]

Figure 2A:
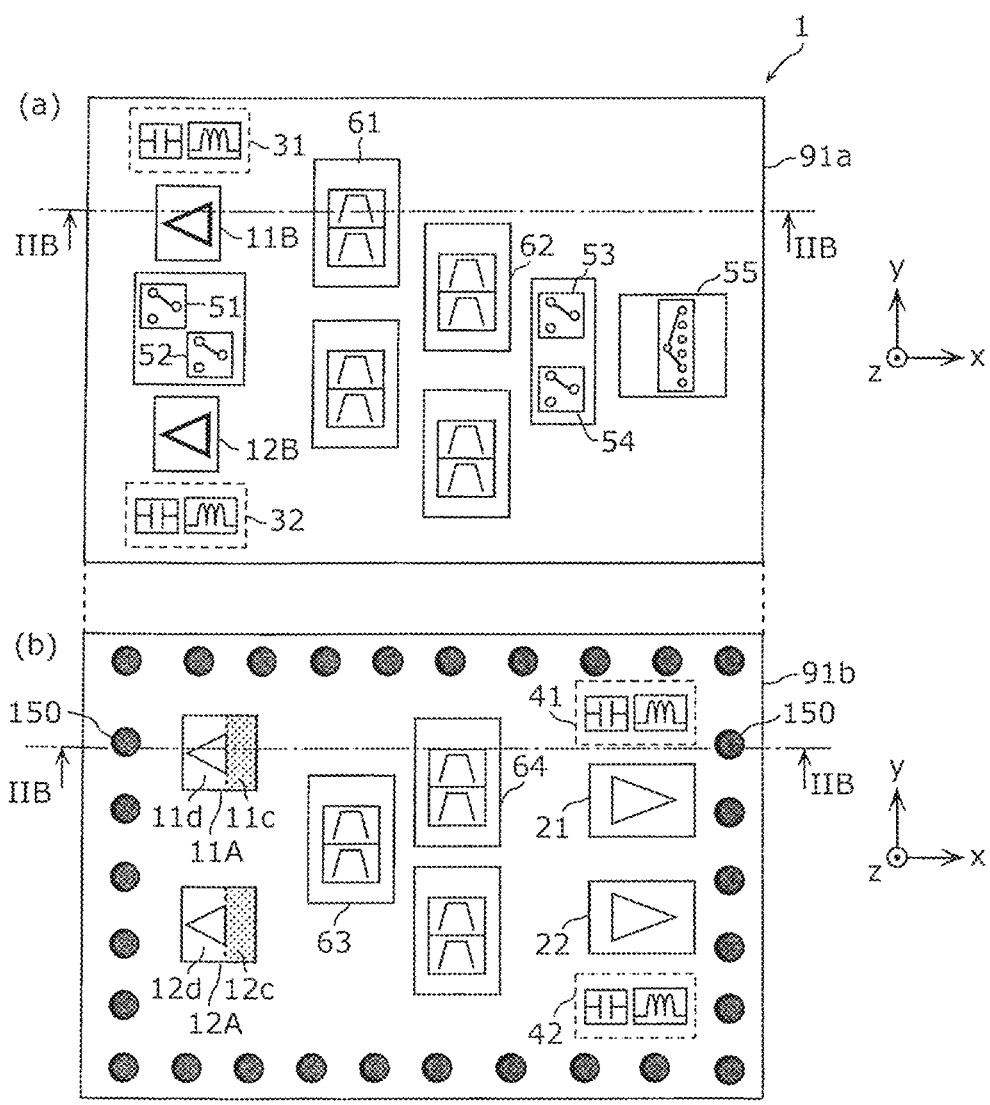
FIG. 2A illustrates schematic diagrams each showing a planar configuration of the radio frequency module according to the embodiment.
Figure 2B:
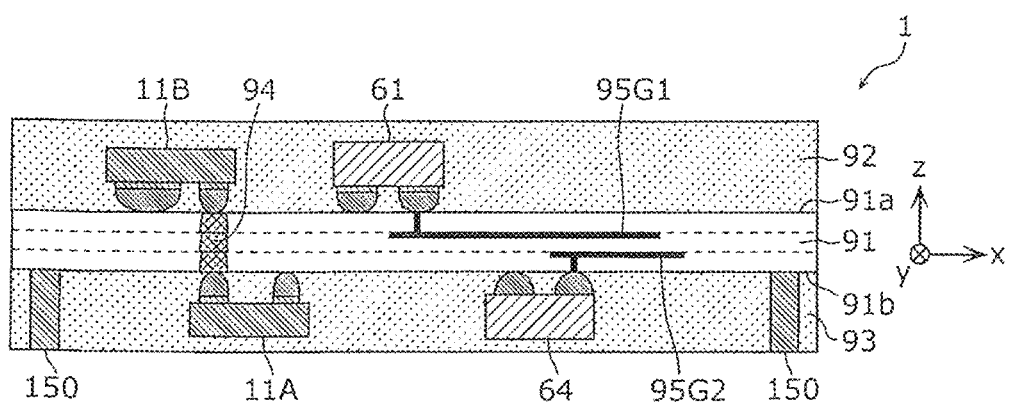
FIG. 2B is a schematic diagram illustrating a cross-sectional configuration of the radio frequency module according to the embodiment.

FIG. 2A illustrates schematic diagrams each showing a planar configuration of radio frequency module 1 according to Embodiment 1. FIG. 2B is a schematic diagram illustrating a cross-sectional configuration of radio frequency module 1 according to Embodiment 1, and specifically, illustrates a cross section taken along line IIB to IIB in FIG. 2A. Note that (a) of FIG. 2A illustrates a layout of circuit elements when principal surface 91a out of principal surfaces 91a and 91b on opposite sides of module board 91 is viewed from the positive z-axis. On the other hand, (b) of FIG. 2A is a perspective view of a layout of circuit elements when principal surface 91b is viewed from the positive z-axis.

As illustrated in FIGS. 2A and 2B, radio frequency module 1 according to the present embodiment further includes module board and resin members 92 and 93, in addition to the circuit configuration illustrated in FIG. 1.

Module board 91 is a board that includes principal surface 91a (a first principal surface) and principal surface 91b (a second principal surface) on opposite sides of module board 91, and on which the transmission circuit and the reception circuit described above are mounted. As module board 91, one of a low temperature co-fired ceramics (LTCC) board and a printed circuit board each having, for example, a stacked structure of a plurality of dielectric layers is used.

Resin member 92 is on principal surface 91a of module board 91, and covers a portion of the transmission circuit, a portion of the reception circuit, and principal surface 91a of module board 91, and has a function of ensuring reliability of mechanical strength and moisture resistance, for instance, of circuit elements included in the transmission circuit and the reception circuit. Resin member 93 is on principal surface 91b of module board 91, covers a portion of the transmission circuit, a portion of the reception circuit, and principal surface 91b of module board 91, and has a function of ensuring reliability of mechanical strength and moisture resistance, for instance, of circuit elements included in the transmission circuit and the reception circuit. Note that resin members 92 and 93 are not necessarily included in the radio frequency module according to the present disclosure.

As illustrated in FIGS. 2A and 2B, amplifying elements 11B and 12B, duplexers 61 and 62, matching circuits 31 and 32, and switches 51 to 55 are mounted on principal surface 91a of module board 91 in radio frequency module 1 according to the present embodiment. On the other hand, amplifying elements 11A and 12A, reception low noise amplifiers 21 and 22, duplexers 63 and 64, and matching circuits 41 and 42 are mounted on principal surface 91b of module board 91. Note that although not illustrated in FIGS. 2A and 2B, matching circuits 71 to 74 may be mounted on either of principal surfaces 91a and 91b of module board 91 or may be provided inside of module board 91.

Amplifying element 11B of transmission power amplifier 11 and amplifying element 12B of transmission power amplifier 12 are mounted on principal surface 91a of module board 91. Amplifying element 11A of transmission power amplifier 11 and amplifying element 12A of transmission power amplifier 12 are mounted on principal surface 91b of module board 91.

Amplifying element 11A includes drive control circuit 11c and drive amplifying element 11d. Drive control circuit 11c generates and controls a bias voltage (current) supplied to drive element 11B and drive amplifying element 11d. Drive amplifying element 11d is an amplification transistor of amplifying element 11A.

Amplifying element 12A includes drive control circuit 12c and drive amplifying element 12d. Drive control circuit 12c generates and controls a bias voltage (current) supplied to drive element 12B and drive amplifying element 12d. Drive amplifying element 12d is an amplification transistor of amplifying element 12A.

Matching circuits 31, 32, 41, and 42 each include at least one of an inductor or a capacitor.

Here, in radio frequency module 1 according to the present embodiment, amplifying elements 11B and 12B are mounted on principal surface 91a of module board 91, and amplifying elements 11A and 12A are mounted on principal surface 91b of module board 91. Thus, amplifying elements 11A and 12A and amplifying elements 11B and 12B are disposed with module board 91 being present therebetween.

Accordingly, amplifying elements 11A and 12A and amplifying elements 11B and 12B can be disposed adjacently so as to overlap one another in a plan view of module board 91. Otherwise stated, a footprint of amplifying element 11A may at least partially overlap with a footprint of amplifying element 11B in a plan view of module board 91, and a footprint of amplifying element 12A may at least partially overlap with a footprint of amplifying element 12B in a plan view of module board 91. Accordingly, radio frequency module 1 can be miniaturized (the area thereof can be decreased), as compared with the case where amplifying elements 11A and 12A and amplifying elements 11B and 12B are disposed on the same surface.

Amplifying elements 11A and 12A and amplifying elements 11B and 12B are disposed adjacently to one another, so that a line that connects amplifying elements 11A and 11B and a line that connects amplifying elements 12A and 12B can be shortened. For example, amplifying elements 11A and 12A and amplifying elements 11B and 12B can be connected using via conductors perpendicularly passing through module board 91. The via conductors have lower resistance than that of a pattern conductor formed in the direction along a principal surface of module board 91. Accordingly, transfer loss of a radio frequency signal transferred between amplifying elements 11A and 11B and transfer loss of a radio frequency signal transferred between amplifying elements 12A and 12B can be reduced, and thus favorable amplification characteristics of transmission power amplifiers 11 and 12 can be ensured.

Amplifying elements 11A and 12A and amplifying elements 11B and 12B are more likely to be disposed adjacently to one another as compared with the case where the amplifying elements are disposed on the same surface, yet interference between (i) amplifying elements 11A and 12A and (ii) amplifying elements 11B and 12B can be reduced owing to module board 91 present therebetween.

Thus, miniaturized radio frequency module 1 can be provided while ensuring favorable amplification characteristics of transmission power amplifier 11 that includes cascaded amplifying elements 11A and 11B and transmission power amplifier 12 that includes cascaded amplifying elements 12A and 12B.

Note that as illustrated in FIG. 2A, amplifying elements 11A and 11B at least partially overlap, and amplifying elements 12A and 12B at least partially overlap, in a plan view of module board 91 (when viewed in the z-axial direction) in radio frequency module 1 according to the present embodiment. Otherwise stated, a footprint of amplifying element 11A at least partially overlaps with a footprint of amplifying element 11B in a plan view of module board 91, and a footprint of amplifying element 12A at least partially overlaps with a footprint of amplifying element 12B in a plan view of module board 91.

According to this, as illustrated in FIG. 2B, amplifying elements 11A and 11B can be connected using only via conductor 94 perpendicularly passing through module board 91. Amplifying elements 12A and 12B can be connected using only a via conductor perpendicularly passing through module board 91. Furthermore, the areas of principal surfaces 91a and 91b of module board 91 can be decreased. Thus, transfer loss of a radio frequency signal transferred between amplifying elements 11A and 11B and transfer loss of a radio frequency signal transferred between amplifying elements 12A and 12B can be further reduced, and furthermore the area of radio frequency module 1 can be decreased.

Note that amplifying elements 11A and 12A may each include a CMOS that contains Si. Accordingly, amplifying elements 11A and 12A that do not require power handling each include a CMOS that contains Si, and thus noise generated in radio frequency module 1 can be decreased and also radio frequency module 1 can be manufactured at low cost. Furthermore, when amplifying elements 11A and 12A and switches 51 to 55 are mounted on the same principal surface, amplifying elements 11A and 12A, switches 51 to 55, and a controller that controls connection of switches 51 to 55 and amplification factors of transmission power amplifiers 11 and 12 and reception low noise amplifiers 21 and 22 may be formed into a single chip using a CMOS that contains Si. Accordingly, radio frequency module 1 can be miniaturized.

As in the present embodiment, when amplifying elements 11A and 12A and amplifying elements 11B and 12B are mounted on different principal surfaces, amplifying elements 11A and 11B may be made of different materials, and amplifying elements 12A and 12B may be made of different materials. For example, amplifying elements 11A and 12A that do not require power handling each include a low-noise and inexpensive CMOS that contains Si, and amplifying elements 11B and 12B that output high power are each made of GaAs-based material, so that high-quality radio frequency module 1 can be provided at low cost.

In radio frequency module 1 according to the present embodiment, plural columnar electrodes 150 passing through resin member 93 are disposed on principal surface 91b of module board 91. Radio frequency module 1 exchanges, via columnar electrodes 150, electric signals with a motherboard disposed on the z-axis negative side of radio frequency module 1. Some of columnar electrodes 150 are set to the ground potential of the motherboard. In the present embodiment, amplifying elements 11A and 12A are mounted on principal surface 91b on which columnar electrodes 150 are formed. Accordingly, when amplifying elements 11A and 12A each include a CMOS that contains Si, columnar electrodes 150 and amplifying elements 11A and 12A that are mounted on principal surface 91b and resin member 93 can be polished by chemical mechanical polishing (CMP), for instance, in the manufacturing process. Accordingly, columnar electrodes 150 and amplifying elements 11A and 12A can be exposed from resin member 93 while planarizing the plane on the principal surface 91b side of radio frequency module 1 that faces the motherboard.

In radio frequency module 1 according to the present embodiment, matching circuits 31 and 32 are mounted on principal surface 91a. According to this, a transmission radio frequency signal of a first frequency band group is input to amplifying element 11A mounted on principal surface 91b, and transferred, through via conductor 94, to amplifying element 11B and matching circuit 31 that are mounted on principal surface 91a. A transmission radio frequency signal of a second frequency band group is input to amplifying element 12A mounted on principal surface 91b, and transferred, through a via conductor, to amplifying element 12B and matching circuit 32 that are mounted on principal surface 91a. Thus, a radio frequency signal can be transferred from the input end of a transmission power amplifier to the output end of a matching circuit through a short signal path. Accordingly, radio frequency module 1 in which transfer loss is reduced can be provided.

[1.3 Arrangement of Reception Low Noise Amplifiers of Radio Frequency Module 1]

Radio frequency module 1 according to the present embodiment includes reception low noise amplifiers 21 and 22 mounted on module board 91. According to this, the transmission power amplifiers and the reception low noise amplifiers are mounted on a single board, and thus a composite transmission and reception module having favorable amplification characteristics yielded by transmission power amplifiers 11 and 12 can be provided.

In radio frequency module 1 according to the present embodiment, reception low noise amplifiers 21 and 22 are mounted on principal surface 91b. Thus, high-power amplifying elements 11B and 12B and reception low noise amplifiers 21 and 22 are disposed on different principal surfaces of module board 91. According to this, module board 91 is present between (i) amplifying elements 11B and 12B and (ii) reception low noise amplifiers 21 and 22, and thus radio frequency signals output from amplifying elements 11B and 12B can be prevented from directly flowing into reception low noise amplifiers 21 and 22. Accordingly, isolation between the transmission circuit and the reception circuit improves.

Here, in radio frequency module 1 according to the present embodiment, a conductive member mounted on principal surface 91a or 91b is located between (i) most downstream amplifying elements 11B and 12B and (ii) reception low noise amplifiers 21 and 22, in a plan view of module board 91 (when viewed in the z-axis direction). Here, the conductive member is an electronic member that includes a conductive member such as a signal extraction electrode, and is, for example, at least one element out of passive elements such as a resistor, a capacitor, an inductor, a filter, a switch, a signal line, and a signal terminal and active elements such as an amplifier and a control circuit. In the present embodiment, the conductive member is at least one duplexer out of duplexers 61 to 64. Furthermore, the conductive member may be at least one filter out of the transmission filters and the reception filters included in duplexers 61 to 64. The transmission filters and the reception filters included in duplexers 61 to 64 each include conductive members such as signal extraction electrodes, and at least one of the signal extraction electrodes is connected to ground pattern 95G1 or 95G2 provided inside of module board 91 as illustrated in FIG. 2B, for example.

According to the above configuration, amplifying elements 11B and 12B that output high-power radio frequency signals are disposed on principal surface 91a of module board 91, and reception low noise amplifiers 21 and 22 are disposed on principal surface 91b, yet at least one of duplexers 61 to 64 mounted on principal surface 91a or 91b is located between (i) most downstream amplifying elements 11B and 12B and (ii) reception low noise amplifiers 21 and 22. Thus, module board 91 and the conductive member(s) that are present between (i) amplifying elements 11B and 12B and (ii) reception low noise amplifiers 21 and 22 can prevent high-power radio frequency signals generated by amplifying elements 11B and 12B and harmonics thereof from flowing into reception low noise amplifiers 21 and 22. Accordingly, the inflow of harmonic components of high-power radio frequency signals amplified by amplifying elements 11B and 12B into the reception circuit and/or the inflow of intermodulation distortion components resulting from the radio frequency signals and other radio frequency signals into the reception circuit can be decreased, and thus deterioration of reception sensitivity of radio frequency module 1 can be reduced.

Note that the state in which a conductive member mounted on principal surface 91a or 91b is located between (i) amplifying elements 11B and 12B and (ii) reception low noise amplifiers 21 and 22 in a plan view of module board 91 may satisfy, in the plan view, at least one of (1) a state in which the region occupied by the conductive member projected in the plan view at least partially overlaps a line that connects an arbitrary point in the region occupied by amplifying element 11B projected in the plan view and an arbitrary point in the region occupied by reception low noise amplifier 21 projected in the plan view, (2) a state in which the region occupied by the conductive member projected in the plan view at least partially overlaps a line that connects an arbitrary point in the region occupied by amplifying element 12B projected in the plan view and an arbitrary point in the region occupied by reception low noise amplifier 21 projected in the plan view, (3) a state in which the region occupied by the conductive member projected in the plan view at least partially overlaps a line that connects an arbitrary point in the region occupied by amplifying element 11B projected in the plan view and an arbitrary point in the region occupied by reception low noise amplifier 22 projected in the plan view, or (4) a state in which the region occupied by the conductive member projected in the plan view at least partially overlaps a line that connects an arbitrary point in the region occupied by amplifying element 12B projected in the plan view and an arbitrary point in the region occupied by reception low noise amplifier 22 projected in the plan view.

Thus, radio frequency module 1 according to the present embodiment has a configuration in which the conductive member mounted on principal surface 91a or 91b is located between (i) amplifying elements 11B and 12B and (ii) reception low noise amplifiers 21 and 22, yet it is sufficient if the conductive member mounted on principal surface 91a or 91b is located between at least one of amplifying element 11B or 12B and at least one of reception low noise amplifier 21 or 22. Accordingly, the inflow of a harmonic component of a high-power radio frequency signal transferred through a transmission path into a reception path and/or the inflow of an intermodulation distortion component resulting from the radio frequency signal and another radio frequency signal into a reception path can be decreased, and thus deterioration of reception sensitivity of the reception paths can be reduced. Consequently, deterioration of reception sensitivity of radio frequency module 1 can be reduced.

Note that the present embodiment has shown a transmission filter and a reception filter as examples of the conductive member disposed between (i) amplifying elements 11B and 12B and (ii) reception low noise amplifiers 21 and 22, yet other than a transmission filter and a reception filter, the conductive member may be one of (1) amplifying element 11A or 12A, (2) switch 55, (3) switch 51 or 52, (4) switch 53 or 54, (5) a diplexer (a multiplexer) disposed between common terminal 100 and a transmission filter and between common terminal 100 and a reception filter, (6) a chip capacitor, and (7) a control circuit that generates at least one of a control signal for adjusting gains of transmission power amplifiers 11 and 12 and reception low noise amplifiers 21 and 22 or a control signal for controlling switching of switches 51 to 55.

Note that the control circuit in (7) above may be a switch IC that includes at least one of switches 51 to 55.

Note that the circuit elements in (1) to (7) above each desirably include an electrode set to the earth potential or a fixed potential, and are desirably connected to a ground pattern formed inside of module board 91, for example. Accordingly, the electromagnetic-field shielding function of the circuit elements in (1) to (7) above improves.

According to the examples of the conductive member shown above, the electromagnetic fields generated from amplifying elements 11B and 12B can be shielded, and thus high-power radio frequency signals generated by amplifying elements 11B and 12B and harmonics thereof can be prevented from flowing into reception low noise amplifiers 21 and 22. Thus, even if the reception band of one of communication bands A to D includes frequencies of harmonics of radio frequency signals amplified by transmission power amplifiers 11 and 12 and/or frequencies of intermodulation distortion resulting from the radio frequency signals and other radio frequency signals, the inflow of harmonic components of high-power radio frequency signals amplified by amplifying elements 11B and 12B into the reception circuit and/or the inflow of intermodulation distortion components resulting from the radio frequency signals and other radio frequency signals into the reception circuit can be decreased, and thus deterioration of reception sensitivity of radio frequency module 1 can be reduced.

[1.4 Arrangement of Circuit Elements of Radio Frequency Module 1A According to Variation 1]

Figure 3:
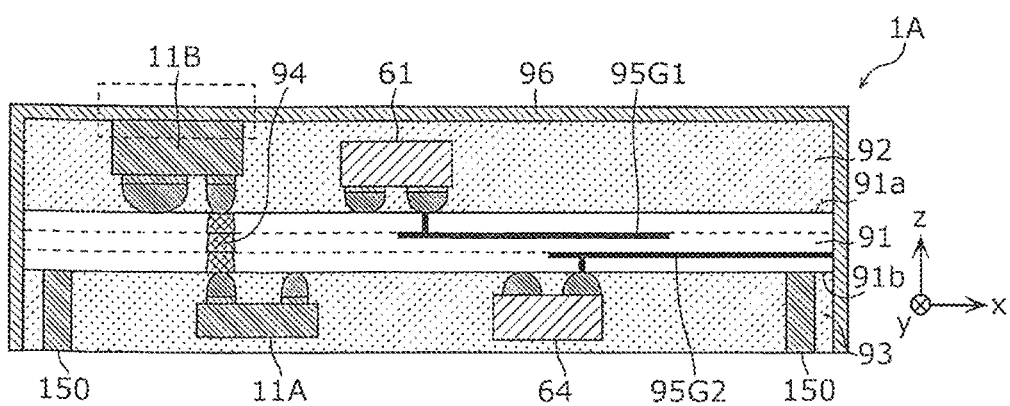
FIG. 3 is a schematic diagram illustrating a cross-sectional configuration of a radio frequency module according to Variation 1 of the embodiment.

FIG. 3 is a schematic diagram illustrating a cross-sectional configuration of radio frequency module 1A according to Variation 1 of the embodiment. Radio frequency module 1A according to this variation is different from radio frequency module 1 according to the embodiment in that shielding-electrode layer 96 is additionally provided. The following description of radio frequency module 1A according to this variation focuses on differences from radio frequency module 1 according to the embodiment while a description of the same points is omitted.

Shielding-electrode layer 96 is formed so as to cover top and side surfaces of resin member 92 and side surfaces of resin member 93, and is connected to ground pattern 95G2 set to the ground potential and provided in module board 91, on a side surface of module board 91. The top surfaces of high-power amplifying elements 11B and 12B are in contact with shielding-electrode layer 96. Since shielding-electrode layer 96 is provided, radio frequency signals output from transmission power amplifiers 11 and 12 can be prevented from being directly radiated from radio frequency module 1A to the outside, and extraneous noise can be prevented from sneaking into circuit elements included in radio frequency module 1A. Furthermore, heat generated by amplifying elements 11B and 12B can be dissipated through shielding-electrode layer 96, and thus heat dissipation properties of radio frequency module 1A improves,

[1.5 Arrangement of Circuit Elements of Radio Frequency Module 1B According to Variation 2]

Figure 4:
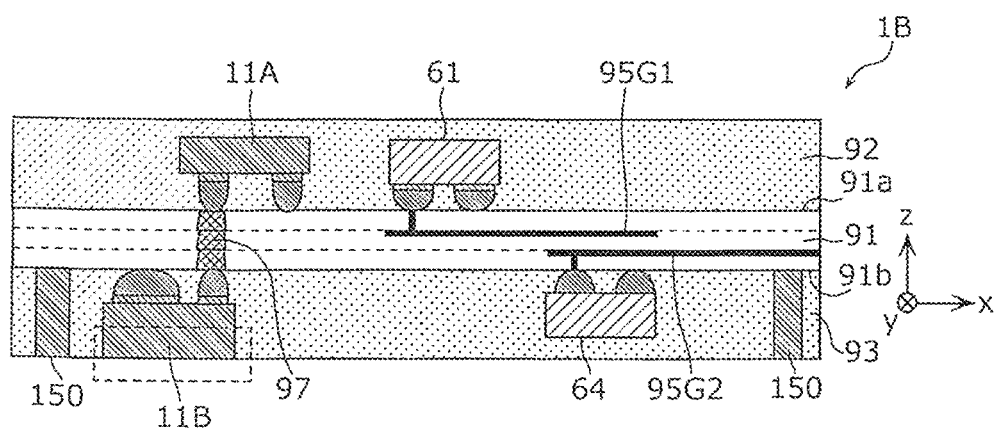
FIG. 4 is a schematic diagram illustrating a cross-sectional configuration of a radio frequency module according to Variation 2 of the embodiment.

FIG. 4 is a schematic diagram illustrating a cross-sectional configuration of radio frequency module 1B according to Variation 2of the embodiment. As illustrated in FIG. 4, radio frequency module 1B according to this variation is different from radio frequency module 1 according to the embodiment, in how amplifying elements included in transmission power amplifiers 11 and 12 are separated and disposed on principal surfaces 91a and 91b. The following description of radio frequency module 1B according to this variation focuses on differences from radio frequency module 1 according to the embodiment while a description of the same points is omitted.

Amplifying element 11B of transmission power amplifier 11 and amplifying element 12B of transmission power amplifier 12 are mounted on principal surface 91b of module board 91. Amplifying element 11A of transmission power amplifier 11 and amplifying element 12A of transmission power amplifier 12 are mounted on principal surface 91a of module board 91.

In radio frequency module 18 according to this variation, amplifying elements 11B and 12B are mounted on principal surface 91b of module board 91, and amplifying elements 11A and 12A are mounted on principal surface 91a of module board 91. Thus, amplifying elements 11A and 12A and amplifying elements 11B and 12B are disposed with module board 91 being present therebetween.

Accordingly, amplifying elements 11A and 12A and amplifying elements 11B and 12B can be disposed more adjacently to one another, as compared with the case where amplifying elements 11A and 12A and amplifying elements 11B and 12B are disposed on the same surface. Accordingly, a line that connects amplifying elements 11A and 11B and a line that connects amplifying elements 12A and 12B can be shortened. Amplifying elements 11A and 12A and amplifying elements 11B and 12B can be connected using via conductors perpendicularly passing through module board 91. Consequently, transfer loss of a radio frequency signal transferred between amplifying elements 11A and 11B and transfer loss of a radio frequency signal transferred between amplifying elements 12A and 12B can be reduced, and thus favorable amplification characteristics of transmission power amplifiers 11 and 12 can be ensured.

Amplifying elements 11A and 12A and amplifying elements 11B and 12B are more likely to be disposed adjacently to one another as compared with the case where the amplifying elements are disposed on the same surface, yet interference between (i) amplifying elements 11A and 12A and (ii) amplifying elements 11B and 12B can be reduced owing to module board 91 present therebetween.

Thus, miniaturized radio frequency module 1B can be provided while ensuring favorable amplification characteristics of transmission power amplifier 11 that includes cascaded amplifying elements 11A and 11B and transmission power amplifier 12 that includes cascaded amplifying elements 12A and 12B.

As illustrated in FIG. 4, amplifying elements 11A and 11B are connected using only via conductor 97 perpendicularly passing through module board 91, and thus transfer loss of a radio frequency signal transferred between amplifying elements 11A and 11B can be reduced, and the area of radio frequency module 1 can be decreased.

In radio frequency module 1B according to this variation, plural columnar electrodes 150 passing through resin member 93 are disposed on principal surface 91b of module board 91. Radio frequency module 1B exchanges, via columnar electrodes 150, electric signals with a motherboard disposed on the z-axis negative side of radio frequency module 1B. Some of columnar electrodes 150 are set to the ground potential of the motherboard. In this variation, amplifying elements 11B and 12B are mounted on principal surface 91b on which columnar electrodes 150 are formed, and the top surfaces of amplifying elements 11B and 12B are exposed from resin member 93. Accordingly, heat generated by high-power amplifying elements 11B and 12B can be dissipated through the top surfaces of amplifying elements 11B and 12B, and thus heat dissipation properties of radio frequency module 1B improves.

[1.6 Summary of Embodiment]

As described above, radio frequency module 1 according to the present embodiment includes: transmission power amplifier 11 (a first transmission power amplifier) that includes a plurality of amplifying elements that are cascaded; and module board 91 that includes principal surfaces 91a and 91b. The plurality of amplifying elements include: amplifying element 11B (a first amplifying element) mounted on principal surface 91a, and disposed most downstream of the plurality of amplifying elements; and amplifying element 11A (a second amplifying element) mounted on principal surface 91b, and disposed upstream of amplifying element 11B.

According to the above configuration, amplifying elements 11A and 11B can be disposed adjacently so as to overlap each other in a plan view of module board 91. Otherwise stated, a footprint of amplifying element 1A may at least partially overlap with a footprint of amplifying element 11B in a plan view of module board 91. Accordingly, radio frequency module 1 can be miniaturized (the area thereof can be decreased), as compared with the case where amplifying elements 11A and 12A and amplifying elements 11B and 12B are disposed on the same surface.

A line that connects amplifying elements 11A and 11B can be shortened by disposing amplifying elements 11A and 11B adjacently to each other. For example, amplifying elements 11A and 11B can be connected using via conductor 94 perpendicularly passing through module board 91. Accordingly, transfer loss of a radio frequency signal transferred between amplifying elements 11A and 11B can be reduced.

Amplifying elements 11A and 11B are more likely to be disposed adjacently to each other as compared with the case where the amplifying elements are disposed on the same surface, yet interference between amplifying elements 11A and 11B can be reduced owing to module board 91 being present therebetween. Accordingly, miniaturized radio frequency module 1 can be provided while ensuring favorable amplification characteristics of transmission power amplifier 11 that includes cascaded amplifying elements 11A and 11B.

Radio frequency module 1 according to the present embodiment may further include: common terminal 100; transmission input terminal 110 (a first transmission input terminal); reception output terminal 130 (a first reception output terminal); and reception low noise amplifier 21 (a first reception low noise amplifier) mounted on module board 91, and configured to amplify a radio frequency signal input through common terminal 100 and output the radio frequency signal amplified to reception output terminal 130. Transmission power amplifier 11 may be configured to amplify a radio frequency signal input through transmission input terminal 110, and output the radio frequency signal amplified to common terminal 100.

According to this, transmission power amplifier 11 and reception low noise amplifier 21 are both mounted on module board 91, and thus a miniaturized composite transmission and reception module having favorable amplification characteristics yielded by transmission power amplifier 11 can be provided.

Furthermore, in radio frequency module 1 according to the present embodiment, a conductive member mounted on principal surface 91a or 91b may be located between amplifying element 11B and reception low noise amplifier 21, in a plan view of module board 91.

Accordingly, even if the reception band of communication band A includes frequencies of harmonics of a radio frequency signal amplified by transmission power amplifier 11 and/or frequencies of intermodulation distortion resulting from the radio frequency signal and another radio frequency signal, a high-power radio frequency signal generated by amplifying element 11B and harmonics thereof can be prevented from flowing into reception low noise amplifier 21. Accordingly, the inflow of a harmonic component of a high-power radio frequency signal amplified by amplifying element 11B into the reception circuit and/or an intermodulation distortion component resulting from the radio frequency signal and another radio frequency signal into the reception circuit can be reduced, and thus the fall of reception sensitivity of radio frequency module 1 can be reduced.

Radio frequency module 1 according to the present embodiment includes: common terminal 100; transmission input terminal 110 (a first transmission input terminal); transmission input terminal 120 (a second transmission input terminal); reception output terminal 130 (a second reception output terminal); reception output terminal 140 (a first reception output terminal); transmission power amplifier 11 (a first transmission power amplifier) configured to amplify a radio frequency signal input through transmission input terminal 110, and output the radio frequency signal amplified to common terminal 100; transmission power amplifier 12 (a second transmission power amplifier) configured to amplify a radio frequency signal input through transmission input terminal 120, and output the radio frequency signal amplified to common terminal 100; reception low noise amplifier 21 (a second reception low noise amplifier) configured to amplify a radio frequency signal input through common terminal 100, and output the radio frequency signal amplified to reception output terminal 130; reception low noise amplifier 22 (a first reception low noise amplifier) configured to amplify a radio frequency signal input through common terminal 100, and output the radio frequency signal amplified to reception output terminal 140; and module board 91 on which transmission power amplifiers 11 and 12 and reception low noise amplifiers 21 and 22 are mounted, module board 91 including principal surfaces 91a and 91b on opposite sides of module board 91. Transmission power amplifier 11 is configured to amplify a radio frequency signal of a transmission band of communication band A, transmission power amplifier 12 is configured to amplify a radio frequency signal of a transmission band of communication band C, reception low noise amplifier 21 is configured to amplify a radio frequency signal of a reception band of communication band A, and reception low noise amplifier 22 is configured to amplify a radio frequency signal of a reception band of communication band C. Transmission power amplifier 11 includes: amplifier input terminal 111; amplifier output terminal 112; and a plurality of amplifying elements tandemly connected to one another between amplifier input terminal 111 and amplifier output terminals 112. The plurality of amplifying elements include amplifying element 11B (a first amplifying element) mounted on principal surface 91a, and disposed most downstream of the plurality of amplifying elements, and amplifying element 11A (a second amplifying element) mounted on principal surface 91b, and disposed upstream of amplifying element 11B. Transmission power amplifier 12 includes: amplifier input terminal 121; amplifier output terminal 122; and a plurality of amplifying elements tandemly connected to one another between amplifier input terminal 121 and amplifier output terminal 122. The plurality of amplifying elements include amplifying element 12B (a first amplifying element) mounted on principal surface 91a, and disposed most downstream of the plurality of amplifying elements, and amplifying element 12A (a second amplifying element) mounted on principal surface 91b, and disposed upstream of amplifying element 1B. Here, a conductive member mounted on principal surface 91a or 91b is located between (i) amplifying elements 11B and 12B and (ii) reception low noise amplifiers 21 and 22, in a plan view of module board 91.

Accordingly, even if the reception band of communication band A or C includes frequencies of harmonics of a radio frequency signal amplified by transmission power amplifier 11 and/or frequencies of intermodulation distortion resulting from the radio frequency signal and another radio frequency signal, a high-power radio frequency signal generated by amplifying element 11B and harmonics thereof can be prevented from flowing into reception low noise amplifier 21 or 22. Accordingly, the inflow of a harmonic component of a high-power radio frequency signal amplified by amplifying element 11B into the reception circuit and/or an intermodulation distortion component resulting from the radio frequency signal and another radio frequency signal into the reception circuit can be reduced, and thus the fall of reception sensitivity of radio frequency module 1 can be reduced.

[Other Embodiments Etc.]

The above has described the radio frequency module and the communication device according to embodiments of the present disclosure, based on the embodiment and the variations thereof, yet the radio frequency module and the communication device according to the present disclosure are not limited to the embodiment and the variations thereof described above. The present disclosure also encompasses another embodiment achieved by combining arbitrary elements in the embodiment and the variations thereof, variations as a result of applying various modifications that may be conceived by those skilled in the art to the embodiment and the variations thereof without departing from the scope of the present disclosure, and various apparatuses that include the radio frequency module and the communication device according to the present disclosure.

For example, in the radio frequency modules and the communication devices according to the embodiment and the variations thereof, another circuit element and another line, for instance, may be disposed between circuit elements and paths that connect signal paths illustrated in the drawings.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be widely used in communication apparatuses such as mobile phones, as a radio frequency module disposed in a front-end portion that supports multiband technology.

The invention claimed is:
1. A radio frequency module, comprising:
a first transmission power amplifier that includes a plurality of amplifying elements that are cascaded; and
a module board on which the first transmission power amplifier is mounted, the module board including a first principal surface and a second principal surface on opposite sides of the module board, wherein
the plurality of amplifying elements include
a first amplifying element mounted on the first principal surface; and
a second amplifying element mounted on the second principal surface and disposed upstream on a signal path from the first amplifying element.
2. The radio frequency module of claim 1, wherein
the second amplifying element includes a complementary metal oxide semiconductor (CMOS) that contains silicon.
3. The radio frequency module of claim 1, wherein
the first amplifying element and the second amplifying element are connected by a via conductor that perpendicularly passes through the module board.
4. The radio frequency module of claim 1, further comprising:
a resin member on the second principal surface, the resin member covering at least partially the second amplifying element.

5. The radio frequency module of claim 4, further comprising:
a columnar electrode connected to the second principal surface, the columnar electrode passing through the resin member perpendicularly to the second principal surface.

6. The radio frequency module of claim 1, wherein
the first amplifying element and the second amplifying element are made of different materials.

7. The radio frequency module according to claim 1, wherein
the first amplifying element is made of GaAs.

8. The radio frequency module of claim 1, wherein
a footprint of the first amplifying element at least partially overlaps a footprint of the second amplifying element in a plan view of the module board.

9. The radio frequency module of claim 8, wherein
a conductive member mounted on the first principal surface or the second principal surface is located between the first amplifying element and the first reception low noise amplifier, in a plan view of the module board.

10. The radio frequency module of claim 9, wherein the conductive member is one of:
the second amplifying element;
a first switch configured to switch between conduction and non-conduction between the common terminal and the first transmission power amplifier;
a second switch configured to switch between conduction and non-conduction between the common terminal and the first reception low noise amplifier;
a transmission filter disposed on a transmission path that connects the common terminal and the first transmission power amplifier;
a reception filter disposed on a reception path that connects the common terminal and the first reception low noise amplifier;
a multiplexer disposed between the common terminal and the transmission filter and between the common terminal and the reception filter;
a metal chip;
a chip capacitor; and
a control circuit configured to generate at least one of a control signal for adjusting a gain of the first transmission power amplifier and a gain of the first reception low noise amplifier or a control signal for controlling switching of the first switch and the second switch.

11. The radio frequency module of claim 9, wherein
the conductive member includes an electrode connected to a ground pattern that the module board includes.

12. The radio frequency module of claim 1, further comprising:
a common terminal;
a first transmission input terminal;
a first reception output terminal; and
a first reception low noise amplifier mounted on the module board, and configured to amplify and output, to the first reception output terminal, a radio frequency signal input through the common terminal, wherein
the first transmission power amplifier is configured to amplify and output, to the common terminal, a radio frequency signal input through the first transmission input terminal.

13. The radio frequency module of claim 12, wherein
the first reception low noise amplifier is mounted on the second principal surface.

14. The radio frequency module of claim 12, wherein
the first transmission power amplifier is configured to amplify a radio frequency signal of a transmission band of a first communication band, and
the first reception low noise amplifier is configured to amplify a radio frequency signal of a reception band of the first communication band.

15. The radio frequency module of claim 14, wherein the reception band of the first communication band includes at least one of:
a frequency of a harmonic component of the radio frequency signal amplified by the first transmission power amplifier; and
a frequency of an intermodulation distortion component resulting from the radio frequency signal amplified by the first transmission power amplifier and another radio frequency signal.

16. The radio frequency module of claim 12, wherein
the first transmission power amplifier is configured to amplify a transmission radio frequency signal of a transmission band of a first communication band, and
the first reception low noise amplifier is configured to amplify a radio frequency signal of a reception band of a second communication band different from the first communication band.

17. The radio frequency module of claim 16, wherein the radio frequency module further comprises:
a second transmission input terminal;
a second reception output terminal;
a second transmission power amplifier configured to amplify and output, to the common terminal, a radio frequency signal of the second communication band included in a radio frequency signal input through the second transmission input terminal; and
a second reception low noise amplifier configured to amplify and output, to the second reception output terminal, a radio frequency signal of the first communication band included in a radio frequency signal input through the common terminal.

18. The radio frequency module of claim 17, wherein the reception band of the second communication band includes at least one of:
a frequency of a harmonic component of the radio frequency signal amplified by the first transmission power amplifier; and
a frequency of an intermodulation distortion component resulting from the radio frequency signal amplified by the first transmission power amplifier and another radio frequency signal.

19. A communication device, comprising:
a radio frequency (RF) signal processing circuit configured to process radio frequency signals transmitted and received by an antenna; and
a radio frequency module configured to transfer the radio frequency signals between the antenna and the RF signal processing circuit, wherein
the radio frequency module comprises
a transmission power amplifier that includes a plurality of amplifying elements that are cascaded; and
a module board on which the transmission power amplifier is mounted, the module board including a first principal surface and a second principal surface on opposite sides of the module board, and
the plurality of amplifying elements include
a first amplifying element mounted on the first principal surface; and a second amplifying element mounted on the second principal surface and disposed upstream on a signal path from the first amplifying element.

20. A radio frequency module, comprising:
a module board including a first principal surface and a second principal surface on opposite sides of the module board;
a transmission input terminal;
an antenna connection terminal; and
a transmission power amplifier including at least a first amplifying element and a second amplifying element in a cascaded configuration, wherein
the first amplifying element is mounted on the first principal surface and disposed closer to the antenna connection terminal than the transmission input terminal on a signal path between the transmission input terminal and the antenna connection terminal,
the second amplifying element is mounted on the second principal surface and disposed closer to the transmission input terminal than the antenna connection terminal on the signal path between the transmission input terminal and the antenna connection terminal, and
a footprint of the first amplifying element at least partially overlaps a footprint of the second amplifying element in a plan view of the module board.

* * * * *